United States Patent [19]
Nariishi

[11] Patent Number: 5,581,097
[45] Date of Patent: Dec. 3, 1996

[54] METHOD OF FABRICATING SEMICONDUCTOR DEVICE USING SHARED CONTACT HOLE MASKS AND SEMICONDUCTOR DEVICE USING SAME

[75] Inventor: Masaaki Nariishi, Tokyo, Japan

[73] Assignee: Kawasaki Steel Corporation, Kobe, Japan

[21] Appl. No.: 321,736

[22] Filed: Oct. 12, 1994

[30] Foreign Application Priority Data

Oct. 13, 1993 [JP] Japan ..................................... 5-255718
Dec. 13, 1993 [JP] Japan ..................................... 5-311541

[51] Int. Cl.⁶ .......................... H01L 27/10; H01L 23/48; H01L 23/52
[52] U.S. Cl. .......................... 257/208; 257/202; 257/211; 257/758; 257/773
[58] Field of Search .................................... 257/202, 208, 257/211, 204, 758, 773, 774

[56] References Cited

U.S. PATENT DOCUMENTS 4,412,240  10/1983  Kikuchi et al. ......................... 257/204

FOREIGN PATENT DOCUMENTS

| 50-28796 | 4/1974 | Japan | 257/202 |
| 56-118350 | 9/1981 | Japan | 257/210 |
| 60-046048 | 3/1985 | Japan | 257/211 |
| 05075075 | 3/1993 | Japan | 257/208 |
| 05090544 | 4/1993 | Japan | 257/208 |
| 1440512 | 4/1973 | United Kingdom | 257/202 |

OTHER PUBLICATIONS

D. J. Elliott, "Integrated Circuit Fabrication Technology", 1982, McGraw–Hill, Inc., New York, pp. 58–61.

*Primary Examiner*—Steven H. Loke
*Attorney, Agent, or Firm*—Bardehle, Pagenberg, Dost, Altenburg, Frohwitter, Geissler and Partners

[57] ABSTRACT

A semi-custom semiconductor device adapted for a master slice approach includes basic cells arranged in an array, wherein the cells are configured such that connection hole placeable positions are at lattice points of a grid which is spaced a predetermined distance from a custom wiring grid having a uniform predetermined lattice spacing. The semiconductor device is prepared by forming basic cells in a silicon wafer as an array, forming a first interlayer insulating film thereon, perforating contact holes at all contact hole placeable positions aligned with lattice points of a grid spaced a predetermined distance from a customizing wiring grid through a contact hole sharing mask, forming a first metal layer thereon, thereby providing a master wafer, etching the master wafer through a custom mask to form a first metal wiring layer on the custom wiring grid and between it and the contact hole, forming a second interlayer insulating film thereon, perforating via holes at via hole placeable positions aligned with lattice points of a grid spaced a predetermined distance from the customizing wiring grid, forming a second metal layer thereon, and etching the second metal layer to form a second metal wiring layer. The invention facilitates designing, reduces the development cost, and advances the delivery date of a semi-custom semiconductor device.

12 Claims, 11 Drawing Sheets

Fig. 4(a)
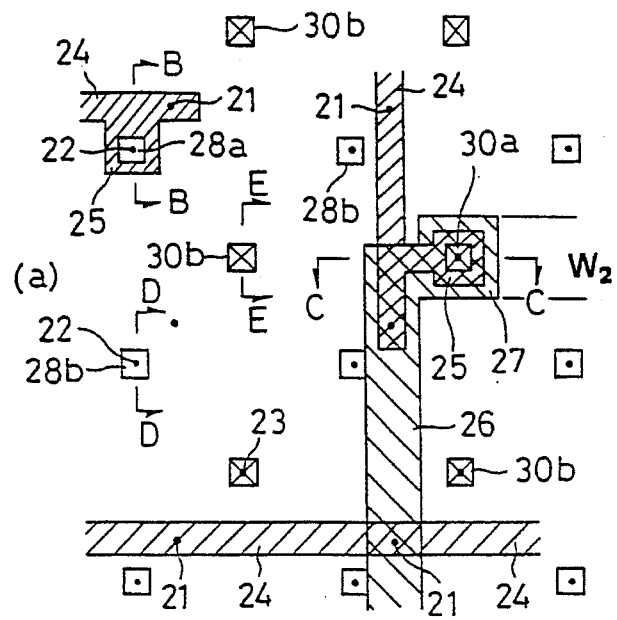
Fig. 4(b)
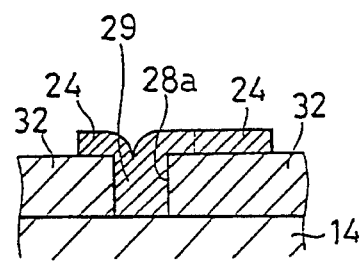
Fig. 4(c)
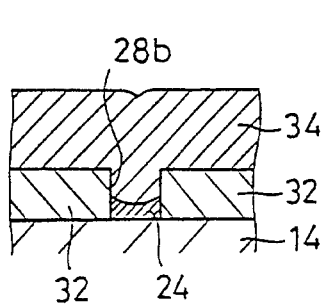
Fig. 4(d)
Fig. 4(e)

Fig. 8(a)
(Prior Art)
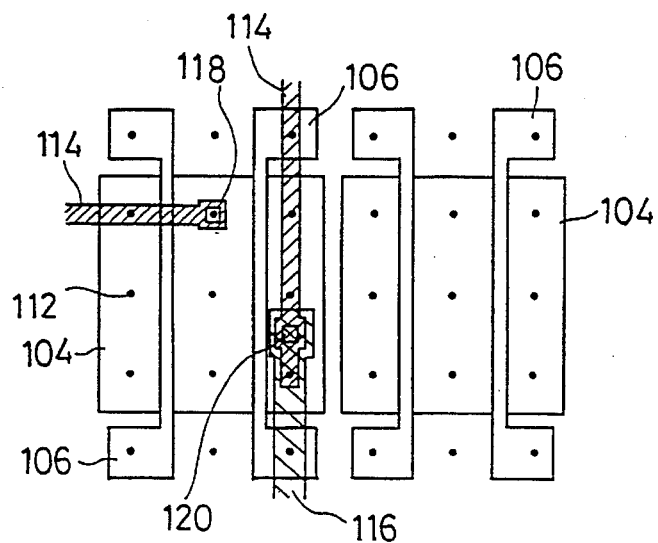
Fig. 8(b)
(Prior Art)
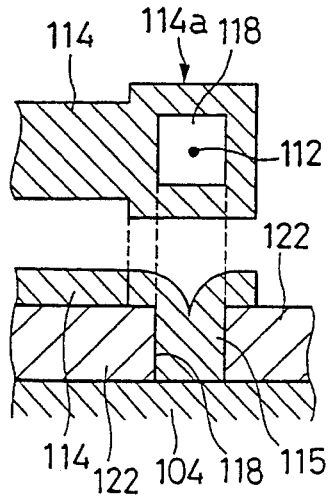
Fig. 8(c)
(Prior Art)
Fig. 8(d)
(Prior Art)
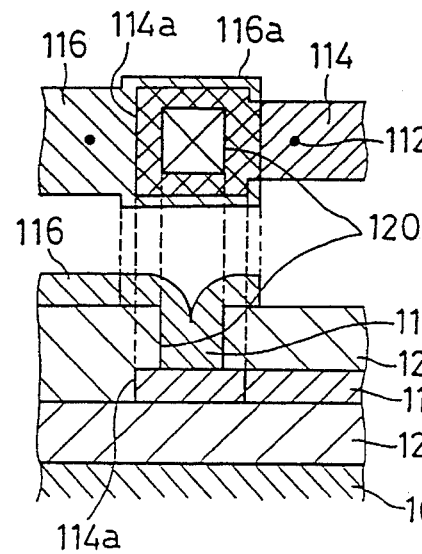
Fig. 8(e)
(Prior Art)

METHOD OF FABRICATING SEMICONDUCTOR DEVICE USING SHARED CONTACT HOLE MASKS AND SEMICONDUCTOR DEVICE USING SAME

BACKGROUND OF THE INVENTION

This invention relates to a semi-custom semiconductor device adapted for a master slice approach such as a gate array and embedded cell array and a method for fabricating the same. More particularly, it relates to a semiconductor device capable of sharing a mask for forming connection holes in steps of forming custom wiring for fabricating a semi-custom semiconductor device adapted for a master slice approach to form a desired logic, and a method for fabricating the semiconductor device which method can reduce the number of the steps of forming the custom wiring and shorten the period taken until product delivery.

In semiconductor devices such as IC and LSI, a variety of elements are formed on a semiconductor substrate and electrically interconnected by applying wiring lines between the elements. The recent advance in integration and miniaturization of elements requires to use a multi-level wiring structure of two or more layers for interconnection. Then in semiconductor devices, for example, semi-custom semiconductor devices intended for a master slice approach such as gate arrays, elements formed on a semiconductor substrate are electrically connected by way of through-holes. In the case of a gate array, for example, a diffusion layer and a gate constituting a basic cell and a first wiring layer are electrically connected through contact holes, and wiring layers, for example, first and second wiring layers are electrically connected through via holes.

In the fabrication of a gate array, a common master wafer is prepared using a common diffusion mask and insulating mask which are previously designed and fabricated. A specific metal wiring layer-forming mask corresponding to a logic circuit design is designed and prepared. By using such a mask in the final step of processing the semiconductor wafer, a circuit design term is shortened. To facilitate the designing of a gate array, that is, to facilitate the designing of a specific metal wiring layer (custom wiring layer) corresponding to a circuit design, JP-A 28786/1975 discloses to form a custom wiring layer by using a grid structure having a uniform lattice spacing, thereby facilitating the designing of a semiconductor device by means of a computer.

FIG. 7 illustrates the structure of a wiring grid having a uniform lattice spacing relative to basic cells in a prior art gate array. A basic cell 102 includes a diffusion layer 104 consisting of a P type (p$^+$) diffusion layer 104a and a N type (n$^+$) diffusion layer 104b and two gate electrodes 106 formed on each of the diffusion layers 104a and 104b through a gate oxide film. A plurality of such basic cells 102 are arranged in a grid array on a master chip 108 on which are distributed a wiring grid 110 having a uniform spacing and lattice points 112 of a connection hole (contact hole or via hole) placeable position-defining grid which are coincident with lattice points or intersections of the wiring grid 110. That is, the connection hole placeable position-defining grid (112) and the wiring grid 110 are coincident with each other or coincident with each other at least in one direction, with the lattice points 112 or points on the wiring grid 110 between adjacent lattice points 112 presenting connection hole placeable positions. Therefore, the prior art gate array has such a structure that contact hole placeable positions (112) of the basic cell 102 and via hole placeable positions (112) between wiring layers are present on the customizing wiring grid 110 as in the illustrated example.

FIG. 8(a) illustrates an example in which metal wirings 114 and 116 are applied to a basic cell 102 in a gate array of such a structure. The diffusion layer 104 and a first layer metal wiring 114 formed on the wiring grid 110 are electrically connected through a contact hole 118 perforated at a lattice point 112 of the wiring grid 110 which is a contact hole placeable position. The first layer metal wiring 114 and a second layer metal wiring 116 formed on the wiring grid 110 are electrically connected through a via hole 120 formed (at an intermediate) between adjacent lattice points 112 on the wiring grid 110 which is a via hole (connection hole) placeable position. It is understood that in FIG. 8(a), first and second insulating layers 122 and 124 are omitted for brevity's sake.

FIGS. 8(b) and 8(c) are an enlarged plan view and a cross-sectional view of a portion around the contact hole 118. In these figures, the second insulating layer 124 is omitted for brevity's sake. The contact hole 118 is formed at the position of a lattice point 112 by perforating the first insulating layer 122 deposited on the diffusion layer 104 through a contact hole-forming special mask. The thus formed contact hole 118 is filled with a metal forming the first layer metal wiring, for example, aluminum (Al) during formation of the first layer metal wiring using a first layer metal wiring-forming mask, with the resulting metal fill 115 electrically connecting the diffusion layer 104 and the first layer metal wiring 114. At this point, a wiring connection 114a is formed above the contact hole 118 which is of a rectangular shape having a greater size than the line width of the first layer metal wiring 114 and spreads over the first insulating layer 122, ensuring the above-mentioned electrical connection.

FIGS. 8(d) and 8(e) are an enlarged plan view and a cross-sectional view of a portion around the via hole 120. The via hole 120 is formed at approximately an intermediate between adjacent lattice points 112 on the wiring grid 110 by perforating the second insulating layer 124 deposited on the wiring connection 114a of the first layer metal wiring 114 on the first insulating layer 122 through a via hole-forming special mask. The thus formed via hole 120 is filled with a metal forming the second layer metal wiring 116, for example, aluminum (Al), with the resulting metal fill 117 electrically connecting the first and second layer metal wirings 114 and 116.

The wiring grid 110 has a lattice spacing L sufficient to prevent two wiring connections 114a associated with contact holes 118 from contacting with each other during fabrication even when the wiring connections 114a are adjacent to each other. As shown in FIG. 9, the lattice spacing L is given as a sum of the minimum distance a between the opposed edges of the two wiring connections 114a and the width W of the wiring connection 114a, that is, a+W.

FIG. 10 schematically illustrates the structure of such a prior art semi-custom semiconductor using a master slice approach, for example, a master wafer of a gate array and a double metal wiring process during fabrication of a semiconductor device using the master wafer.

FIG. 10(a) illustrates a master wafer 100 of a CMOS (complementary metal-oxide semiconductor) conventional gate array. The master wafer 100 includes a basic cell 102 which has P$^+$ diffusion layers 104a formed in a N type silicon (Si—N) substrate 101 and a P well 103 also formed therein in which n$^+$ diffusion layers 104*b* are formed. An element isolation film 107 of SiO$_2$ is formed between the diffusion layers 104*a* and 104*b* by local oxidation of silicon (LOCOS). A polysilicon gate 106 is formed above and between two P$^+$ diffusion layers 104*a* through a gate oxide film 105. A first interlayer insulating film (e.g., a PSG film) 122 covers the entire surface of underlying element layers of the basic cell 102.

FIGS. 10(*b*) to 10(*g*) illustrate successive customizing steps for fabricating a semi-custom semiconductor device by applying double metallizations to the master wafer 100 coated with the first interlayer insulating film 122 over the entire surface thereof.

First referring to FIG. 10(*b*), only contact holes 118 for providing contacts are perforated in the first interlayer insulating film 122 of the master wafer 100 by etching through a contact hole-forming custom mask or reticle. Then as shown in FIG. 10(*c*), a first metal layer 114 is formed which fills the contact holes 118 and covers the entire surface of the first interlayer insulating film 122. Then as shown in FIG. 10(*d*), the first metal layer 114 is etched through a customizing first layer wiring-forming mask or reticle to form a first layer metal wiring 114 having a predetermined custom wiring pattern. Then as shown in FIG. 10(*e*), a second interlayer insulating film 124 is deposited thereon which covers the entire surface.

Thereafter, as shown in FIG. 10(*f*), only via holes 120 for use in interconnection between metal wiring layers are perforated in the second interlayer insulating film 124 by etching through a via hole-forming custom mask or reticle. Then as shown in FIG. 10(*g*), a second metal layer 116 is formed which fills the via holes 120 and covers the entire surface of the second interlayer insulating film 124. Then though not shown, but as in FIG. 10(*d*), the second metal layer 116 is etched through a customizing second layer wiring-forming mask or reticle to form a second layer metal wiring 116 having a predetermined custom wiring pattern. Then though not shown, a passivation film is formed on the second layer metal wiring 116, the passivation film is etched through a common passivation via mask to form bonding via holes, and bonding pads are formed before a semiconductor device is completed.

As mentioned above, interconnections between an underlying element layer and a metal wiring layer and between metal wiring layers in the conventional gate array are generally provided through contact holes and via holes. Cost reducing approaches upon development of such a gate array include sharing of underlying masks for forming underlying layers of the basic cell and sharing of passivation via masks for forming bonding pads, whereby a cost reduction is accomplished by reducing the number of masks or reticles formed upon development.

Also the old-fasioned gate array has a structure wherein in a core of a master chip forming a basic cell, a plurality of element or cell-forming regions in each of which a plurality of basic cells are arranged in a row are arranged with wiring or channel regions being interposed therebetween, and cell-to-cell interconnections are formed in the wiring regions. However, for higher integration, sea-of-gates (SOG) type gate arrays or channelless gate arrays having no special wiring region in the core is recently employed for achieving improvements in the degree of integration of gates per chip area and in the flexibility of placement and wiring. High integration gate arrays employ a combination of various techniques as mentioned above.

Moreover, with respect to the channel gate array, for a cost reduction upon development, JP-A 46048/1985 discloses a technique for reducing the number of masks or reticles to be formed upon development by sharing a via hole-forming mask in a wiring region. This technique intends to share a via hole-forming mask by providing connection between an upper wiring layer and a lower wiring layer sandwiching an interlayer insulating film through a via hole which is formed at a position overlapping one wiring layer, but not overlapping the other wiring layer.

The prior art gate array disclosed in JP-A 28786/1975 referred to above and shown in FIGS. 7, 8 and 9 cannot share contact holes or via holes because the metal wiring pattern to be designed for each wiring layer is different for each of circuits. Whenever the circuit design is altered, a set of a contact hole-forming mask as well as a metal wiring-forming mask and a set of a via hole-forming mask and a metal wiring-forming mask, four special masks in total, must be newly prepared, failing to reduce the mask forming cost, to reduce the mask forming time frame, and to advance the product delivery date. Furthermore, whenever one layer of metal wiring is added, two masks of the via hole-forming mask and the metal wiring-forming mask have to be prepared, which causes an increase in production cost. Especially prior art high integration sea-of-gates type gate arrays need to customize a contact hole-forming mask and respective via hole-forming masks (excluding a passivation via hole-forming mask), resulting in a substantially increased development cost.

In the channel gate array disclosed in JP-A 46048/1985, since upper and lower wirings and via holes are formed in special wiring regions, a via hole-forming mask can be shared. However, since the wiring of either the upper or lower wiring layer cannot be equally spaced, a wiring grid having a uniform lattice spacing cannot be used. This undesirably prevents easy computer-aided designing of semiconductor integrated circuits. Further, since the high integration sea-of-gates type (channelless) gate array is free of a special wiring region, a contact hole-forming region and a via hole-forming region overlap, rendering it impossible to share a via mask. The channel gate array wiring technique disclosed in this publication is not applicable to a channelless gate array.

Among the prior art wiring techniques including the one disclosed in JP-A 46048/1985, there is not an available technique of sharing a contact hole-forming mask for providing interconnection between an underlying layer and a wiring layer. Further, since a master wafer for a conventional semi-custom semiconductor device such as a gate array has completed the step of forming the first interlayer insulating film as shown in FIG. 10(*a*), the double metal wiring process requires four customized masks as mentioned above, failing to shorten the customizing step and to advance the product delivery date.

SUMMARY OF THE INVENTION

An object of the present invention is to provide a novel and improved semiconductor device adapted for a master slice approach and fabrication method, which has solved the above-mentioned problems of the prior art, and is effective for facilitating the design, reducing the development cost, and advancing the product delivery date of semi-custom semiconductor devices such as gate arrays (e.g., channel gate arrays and sea-of-gates type gate arrays), standard cells, and embedded cell arrays.

According to a first aspect of the invention, there is provided a semiconductor device adapted for a master slice approach, comprising basic cells arranged in an array. The cells are configured such that the positions where connection holes can be placed relative to the basic cell (referred to as contact hole placeable positions) are at lattice points of a grid which is spaced a predetermined distance from a custom wiring grid having a uniform predetermined lattice spacing.

Preferably, said connection holes are contact holes for providing connection between an underlying layer where the basic cells are formed and a first wiring layer or via holes for providing connection between wiring layers.

Preferably, said connection holes including contact holes or via holes are formed using a common connection hole-forming mask including a common contact hole-forming mask or a common via hole-forming mask through which a common master wafer is perforated at all connections hole placeable positions including all contact hole placeable positions or all via hole placeable positions.

Preferably, wiring to said connection holes is carried out by extending a custom metal wiring layer from a custom metal wiring formed on said custom wiring grid to a wiring connection formed in or around said connection hole.

Preferably, the predetermined distance between the connection hole placeable position and the custom wiring grid is sized such that the connection hole may not contact with an adjacent custom wiring during fabrication.

Preferably, said predetermined lattice spacing is sized such that a wiring connection in said connection hole which is extended from a custom metal wiring formed on said custom wiring grid may not contact with an adjacent, unextended, custom metal wiring of the same custom metal wiring layer during fabrication.

Preferably, an entire or a portion of the wiring metal is left in unused connection holes, and the remaining wiring metal is insulated from other metal wirings with interlayer insulating films.

Preferably, the wiring metal is removed completely from inside of unused connection holes, and the inside of the removed connection holes is filled with interlayer insulating films.

In a second aspect, the invention provides a master wafer for use in the fabrication of a semiconductor device adapted for a master slice approach, comprising an array of basic cells arranged on a silicon wafer. A first interlayer insulating film is deposited on the basic cells and has contact holes reaching the basic cells at all contact hole placeable positions aligned with lattice points of a grid spaced a predetermined distance from a custom wiring grid having a predetermined lattice spacing to be set relative to the basic cells. A first metallization fills the contact holes and covers the entire surface of the first interlayer insulating film.

The present invention also provides a method for fabricating a semiconductor device adapted for a master slice approach by forming basic cells in a silicon wafer as an array of cells arranged thereon. A first interlayer insulating film is formed thereon which covers the entire surface. Contact holes are opened at all contact hole placeable positions aligned with lattice points of a grid spaced a predetermined distance from a customizing wiring grid having a uniform predetermined lattice spacing to be set relative to the basic cells, using a contact hole sharing mask. A first metallization is formed thereon which covers the entire surface, thereby providing a master wafer. The master wafer is etched through a custom mask to form a first metal wiring layer on the custom wiring grid and between it and the contact hole. Subsequently a second interlayer insulating film is formed thereon which covers the entire surface. Via holes are opened at via hole placeable positions aligned with lattice points of a grid spaced a predetermined distance from the customizing wiring grid. A second metallization is formed thereon which covers the entire surface. The second metallization is etched to form a second metal wiring layer.

Preferably, said via holes are formed using a common via hole-forming mask through which a common master wafer is perforated at all via hole placeable positions.

Preferably, wiring to said contact or via hole is carried out by extending a custom metal wiring layer from a custom metal wiring formed on said custom wiring grid to a wiring connection formed in or around said contact or via hole.

Preferably, the predetermined distance between the contact or via hole placeable position and said custom wiring grid is sized such that the contact or via hole may not contact with an adjacent custom wiring during fabrication.

Preferably, said predetermined lattice spacing is sized such that a wiring connection in said contact or via hole which is extended from a custom metal wiring formed on said custom wiring grid may not contact with an adjacent, unextended, custom metal wiring of the same custom metal wiring layer during fabrication.

The present invention also provides, in the method described above, immediately after the second metal wiring layer is formed or after another metal wiring layer is continuously placed thereon by repeating the step of forming a metal wiring layer, the method further comprising the steps of:

forming a passivation film thereon which covers the entire surface, and etching the passivation film to form bonding via holes therein.

BRIEF DESCRIPTION OF THE DRAWINGS

The above and other objects, features and advantages of the invention will be better understood by reading the following description of preferred embodiments taken in conjunction with the accompanying drawings.

FIG. 4(a) is an enlarged view of a portion of the device shown in FIG. 3; FIGS. 4(b), 4(c), 4(d), and 4(e) are cross-sectional views taken along lines B—B, C—C, D—D, and E—E in FIG. 4(a).

FIG. 8(a) is a schematic view of a prior art semiconductor device; FIGS. 8(b) and 8(c) are enlarged plan and cross-sectional views of a contact hole portion thereof; FIGS. 8(d) and 8(e) are enlarged plan and cross-sectional views of a via hole portion thereof.

DETAILED DESCRIPTION OF THE INVENTION

Figure 1A:
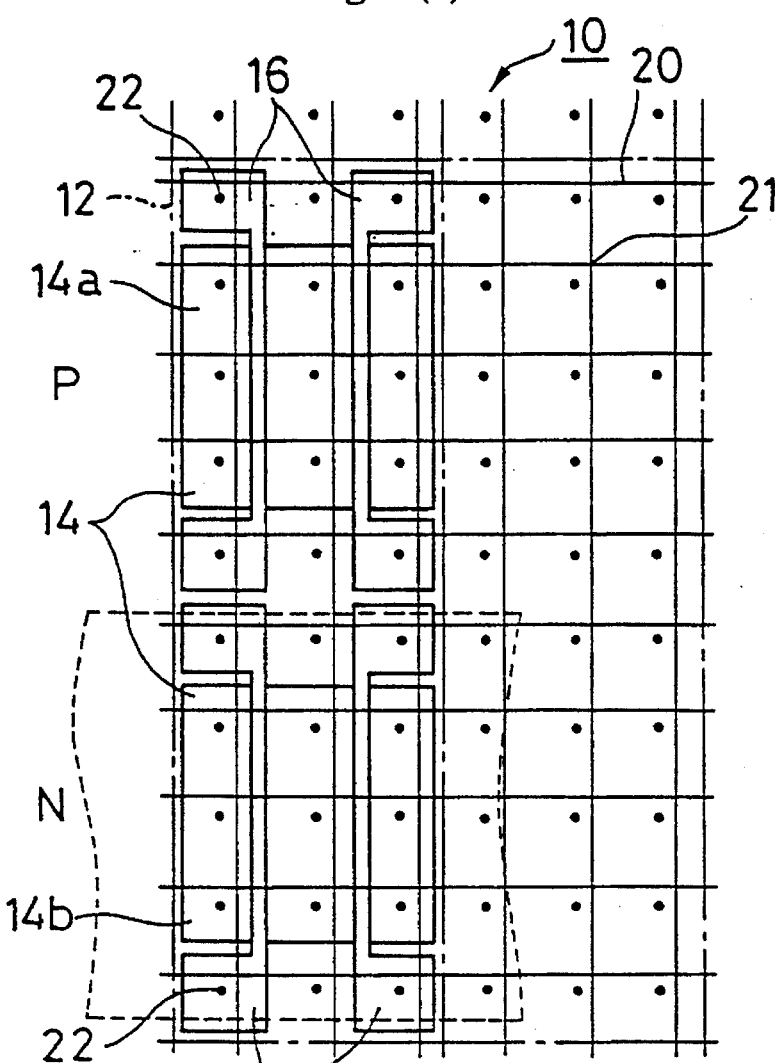
FIGS. 1(a) and 1(b) are schematic and partial enlarged views of a semiconductor device according to one embodiment of the invention, illustrating one exemplary grid structure.

The present invention is described below in detail.

In the semiconductor device of the invention, a transistor arrangement of a basic cell in an underlying layer of a master wafer and a grid for forming connection holes (such as contact holes and via holes) are designed such that a wiring grid of specific metal wiring for use in a circuit design may be present at a position spaced apart from a position where a connection hole (such as a contact hole between an underlying layer and a wiring layer and a via hole between wiring layers) is placeable by a predetermined distance or spacing, that is, a distance which allows, when metal wiring is extended from the metal wiring above the wiring grid to just above a connection hole (such as a contact hole and via hole) and a necessary wiring connection therearound, the distance between the metal wiring from which extension is made and an adjacent metal wiring on the wiring grid of the wiring layer to meet the shortest distance at which the two adjacent metal wiring do not contact with each other during fabrication. That is, the semiconductor device of the invention includes a basic cell which is designed as a double grid structure consisting of a custom wiring grid and a connection hole (contact or via hole) placeable position-defining grid having a phase shifted, equal lattice spacing or a multiple grid structure.

The invention also provides a method for fabricating a semiconductor device having a double grid structure consisting of a custom wiring grid for forming a specific metal wiring used in circuit design (which is set with respect to a transistor arrangement of a basic cell in an underlying element layer of a master wafer) and a grid for forming connection holes (e.g., contact holes and via holes) having a phase shifted, equal lattice spacing or a multiple grid structure.

Therefore, according to the semiconductor device and its fabrication method of the invention, connection holes such as contact holes and via holes can be included in a master wafer (basic design), and a mask for forming contact holes (to be referred to as a contact mask) and a mask for forming via holes (to be referred to as a via mask) can be shared, eliminating a need for customizing. Particularly, the present invention provides a master wafer which is obtained by forming contact holes in the first interlayer insulating film of a conventional master wafer using a contact mask, then filling up the contact holes, and forming a first metal layer which covers the entire surface of the first interlayer insulating film. This leads to many advantages including a reduced load to the computer upon designing, ease and time saving of designing, reduced cost and time saving of mask preparation due to a reduced number of customized masks, and a reduced development cost.

According to the method of the invention, steps subsequent to the step of etching the first metal layer to form a first layer metal wiring having a predetermined wiring pattern are customizing steps. Then the customizing steps can be reduced from nine steps of contact hole formation, first metal layer formation, first layer metal wiring formation, second interlayer insulating film formation, via hole formation, second metal layer formation, second layer metal wiring formation, passivation film formation, and bonding pad formation included as customizing steps in a prior art double metal wiring process to seven steps by removing the two steps of contact hole formation and first metal layer formation. This results in a substantial reduction of the period taken until product delivery.

A semiconductor device adapted for master slice approach and a method for fabricating the same are described below in conjunction with the accompanying drawings in more detail.

Figure 1B:
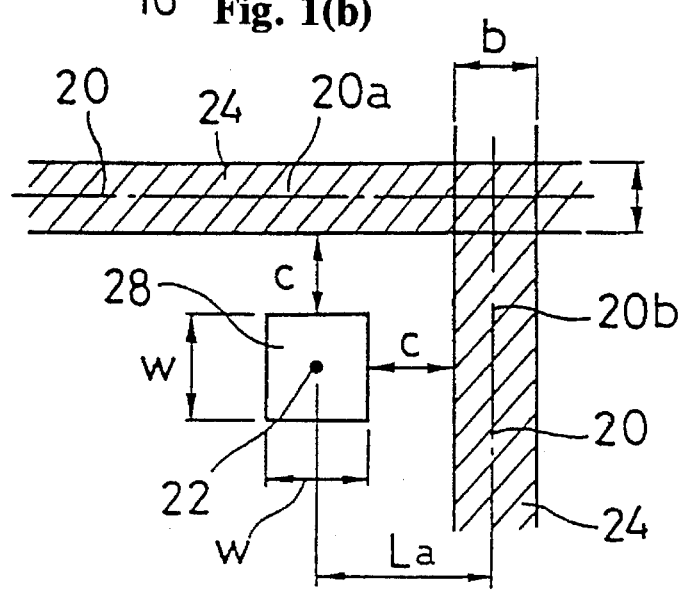

FIG. 1(a) is a schematic plan view of a semiconductor device according to one embodiment of the present invention, illustrating a double grid structure of a basic cell and metal wiring. FIG. 1(b) is a schematic enlarged plan view of a portion of the semiconductor device of FIG. 1(a), illustrating the relation of a contact hole and metal wiring in a basic cell of the semiconductor device. The figures illustrate a sea-of-gates type gate array (known as a channelless gate array) as a typical example of the semiconductor device and a contact hole as a typical connection hole although the present invention is not limited thereto.

In FIG. 1(a), a channelless gate array 10 of the invention includes a silicon substrate (which is a conventional master wafer) on which basic cells 12 are closely arranged in a two-dimensional array. Each basic cell 12 includes a diffusion layer 14 consisting of a P type ($p^+$) diffusion layer 14a and an N type ($n^+$) diffusion layer 14b and two gates 16 formed on both the diffusion layers 14a and 14b through gate oxide films.

In the gate array 10, lattice points 22 are placed at contact hole placeable positions in alignment with the diffusion layers 14a and 14b and gates 16 of the basic cell 12. These lattice points 22 constitute a contact hole placeable position-defining grid (to be referred to as a contact grid, hereinafter) having a uniform predetermined lattice spacing. On the other hand, a wiring grid 20 is disposed and spaced a predetermined distance from the lattice points 22. The wiring grid 20 and the contact grid consisting of the lattice points 22 have an identical lattice spacing.

As shown in FIGS. 1(a) and 1(b), the master wafer of the present invention includes a silicon substrate, basic cells 12 formed thereon in a two-dimensional array, a first interlayer insulating film (simply referred to as a first insulating layer, not shown) layered on the basic cells 12, contact holes 28 perforated in the first insulating layer at all of contact hole placeable lattice points 22, and a first metal layer which fills the contact holes 28 and covers the entire surface of the first interlayer insulating film.

Figure 2A:
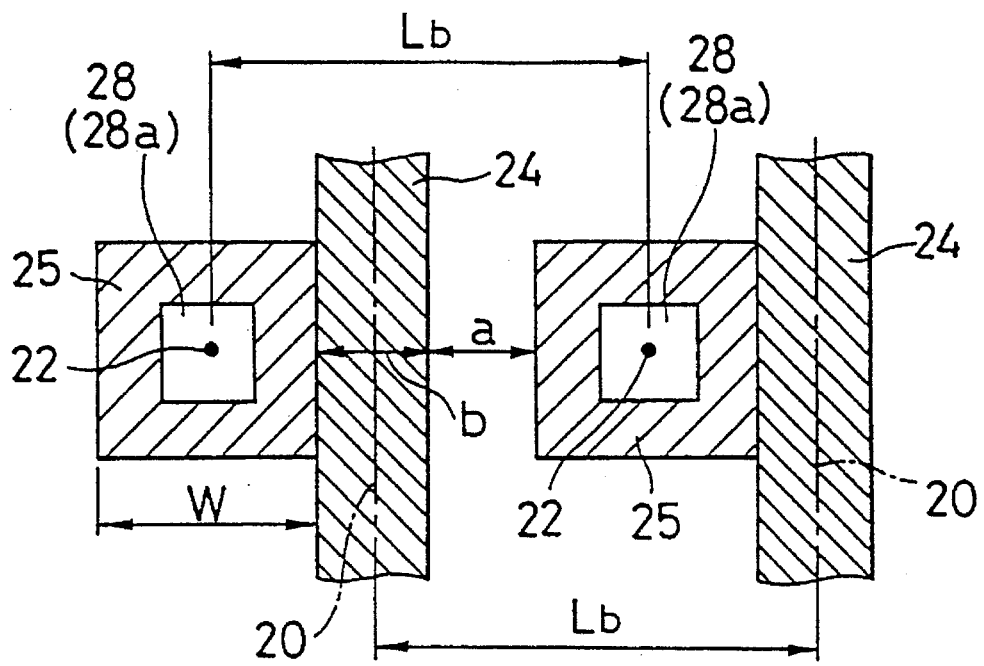
FIGS. 2(a) and 2(b) are schematic views showing connection holes and metal wiring in a semiconductor device according to one embodiment of the invention.
Figure 2B:
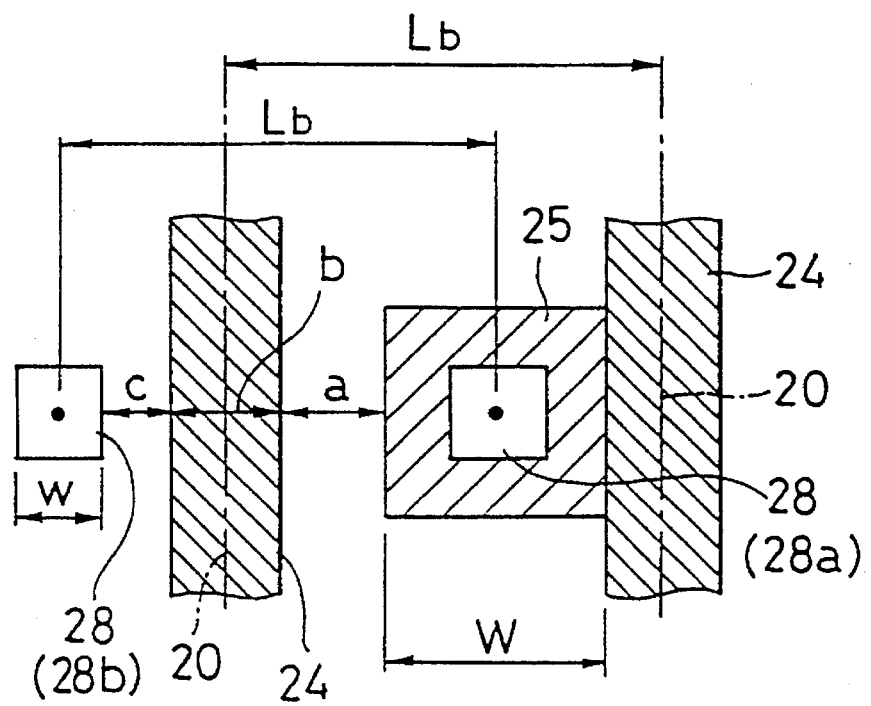

As shown in FIG. 1(b), the spacing La between the lattice point 22 of the contact grid which is a contact hole placeable position and the wiring grid 20 may be at least the shortest distance at which in the same layer, for example, in the first metal wiring layer, a customizing metal wiring 24 formed on the wiring grid 20 does not contact with an adjacent contact hole 28 during fabrication, differently stated, a sufficient spacing to allow a metal wiring 24 to extend by an unused contact hole 28 (28b) as shown in FIG. 2(b). It will be understood that the spacing La should preferably be the shortest distance in order to increase a degree of integration. As shown in FIG. 1(b), the spacing La between adjoining lattice point 22 and wiring grid 20 should be equal to or greater than the sum of the shortest distance c between the opposed edges of a metal wiring 24 and a contact hole 28 at which the edges do not contact during fabrication, one-half of the width b of the metal wiring 24 and one-half of the width w of the contact hole 28, c+(b+w)/2. That is, the spacing La should meet the equation: La>c+(b+w)/2. In conjunction with a lattice point 22 and an adjacent wiring grid 20, both the spacings La between lattice lines 20a in one direction (horizontal in the figure) and between lattice lines 20b in an orthogonal direction (vertical in the figure) should be equal to or greater than c+ (b+w)/2. These two spacings need not necessarily be equal.

Figure 9:
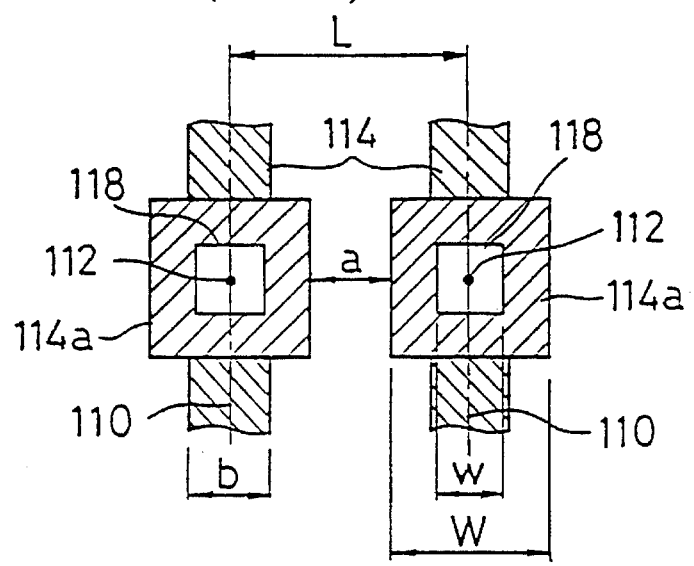
FIG. 9 is a schematic view showing connection holes and metal wiring strips in the prior art semiconductor device.

Referring to FIGS. 2(a) and 2(b), the wiring grid 20 has a lattice spacing Lb which is equal to the lattice spacing of the contact grid, that is, the distance or spacing between adjacent lattice points 22, and may be at least the shortest distance at which in the same layer, for example, in the first metal wiring layer, a wiring connection 25 in a contact hole 28 (28a) which is extended from the customizing metal wiring 24 formed on the wiring grid 20 does not contact with an adjacent metal wiring 24 during fabrication, that is, no electrical conduction takes place therebetween. Accordingly, the lattice spacing Lb should be equal to or greater than the sum of the shortest distance a between the edge of a wiring connection 25 in a contact hole 28 (28a) which is extended from one of two adjacent metal wirings 24 and the edge of the other metal wiring 24 opposed thereto, the width W of the wiring connection 25, and the width b of the metal wiring 24, a+W+b. That is, the lattice spacing Lb should meet the equation: Lb≦a+W+b. It will be understood that the spacing Lb should preferably be the shortest distance: a+W+b (meeting the equation: Lb≦a+W+b) in order to increase a degree of integration. In the gate array 10 of the invention, the lattice spacing Lb of the wiring grid 20 shown in FIGS. 2(a) and 2(b) is greater by the width b of a metal wiring than the lattice spacing L (=a+W) of the wiring grid 110 of the prior art gate array shown in FIG. 9 provided that the connection holes and metal wirings have the same configuration and size.

Although reference is made to the contact holes 28 as connection holes in the illustrated embodiment, via holes 30 to be described later satisfy the same relationship as do the contact holes 28. Therefore, the spacing between a via hole 30 and an adjacent wiring grid 20 and the lattice spacing of a via hole placeable position-defining grid (to be simply referred to as a via grid, hereinafter) can be considered in the same manner as the spacing La between the contact hole 28 and an adjacent wiring grid 20 and the lattice spacing Lb of the contact grid 20.

Figure 3:
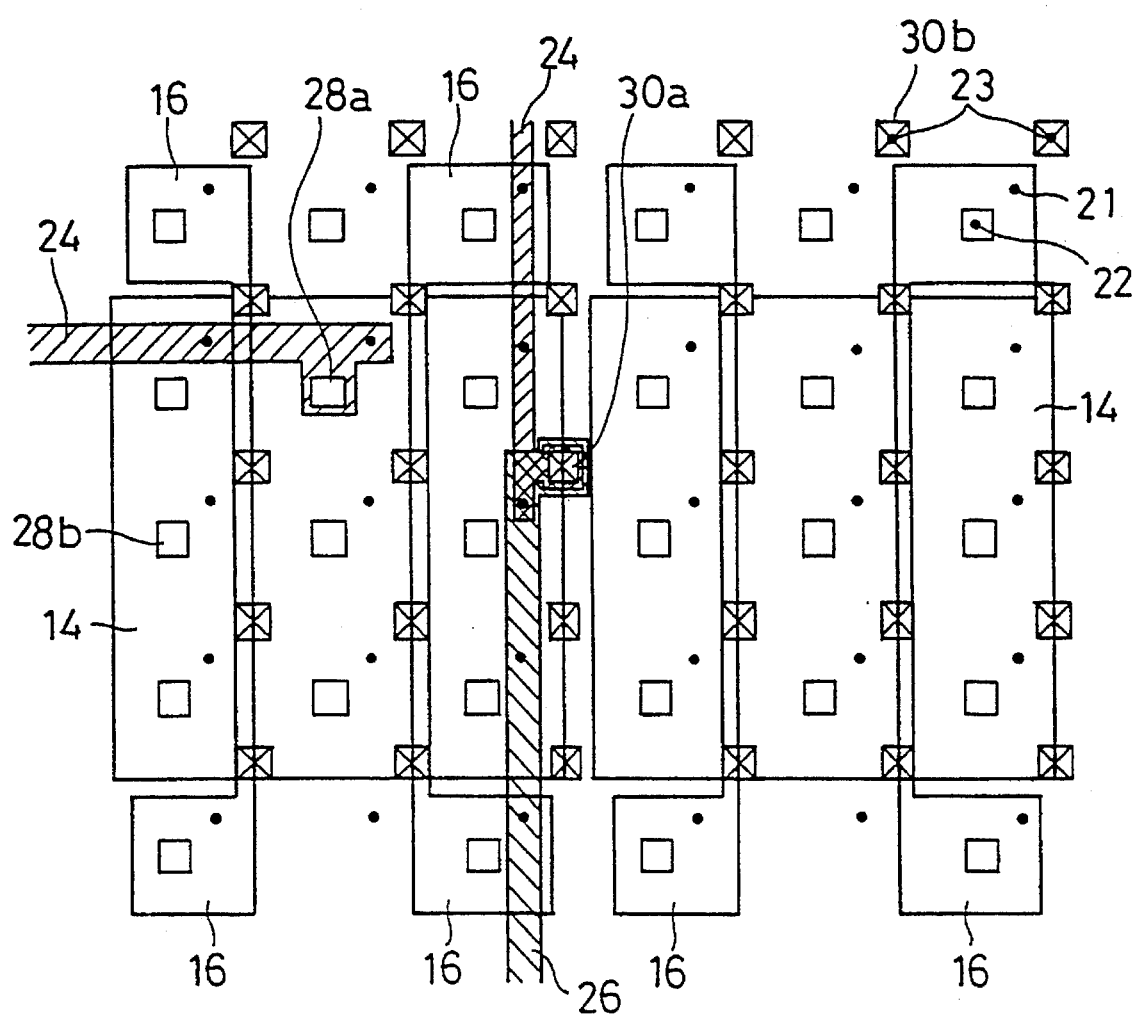
FIG. 3 is a schematic view of a semiconductor device according to another embodiment of the invention.

FIG. 3 shows one embodiment wherein first and second layer metal wirings 24 and 26 are applied to the basic cell of the gate array 10 of the invention having the configuration shown in FIG. 1(a). A portion of the FIG. 3 embodiment is shown in the enlarged view of FIG. 4(a). A contact hole 28a used for providing connection to the first layer metal wiring 24, a via hole 30a used for providing connection to the second layer metal wiring 26, an unused contact hole 28b, and an unused via hole 30b are shown in the cross-sectional views of FIGS. 4(b), 4(c), 4(d), and 4(e), respectively. It is to be noted that in FIGS. 3 and 4(a) to 4(d), the first and second insulating layers 32 and 34 and passivation layer 36 are omitted for brevity's sake.

In the present invention, as shown in FIGS. 3 and 4(a) to 4(e), prior to formation of the first layer metal wiring 24, contact holes 28 which extend through a first insulating layer 32 for providing contact between the basic cell 12 and the first layer metal wiring 24 (or through holes in the first layer insulating film) are formed at all of lattice points 22 of a contact grid which are contact hole placeable positions, using a shared contact hole-forming mask (to be referred to as contact hole-sharing mask or master contact mask).

Thereafter, all the contact holes 28 are filled with the first metal layer and the entire upper surface of the first insulating layer is covered therewith, obtaining a master wafer according to the invention. Further preferably in the practice of the invention, prior to formation of the second layer metal wiring 26, via holes 30 which extend through a second insulating layer 34 for providing connection between the first and second layer metal wirings 24 and 26 (or through holes in the second layer insulating film) are formed at all of lattice points 23 of a via grid which are via hole placeable positions, using a shared via hole-forming mask (to be referred to as via hole-sharing mask or master via mask). Although the lattice points 22 of the contact grid and the lattice points 23 of the via grid are arranged to be opposed with respect to the lattice points 21 of the wiring grid 20 in the illustrated embodiment, the present invention is not limited thereto. The lattice points may be provided at the same position or opposed with respect to a line connecting the lattice points 21 of the wiring grid 20.

In FIGS. 3 and 4(a), the diffusion layer 14 under the first insulating layer 32 and the first metal wiring 24 formed on the first insulating layer 32 and along a line connecting the lattice points 21 of the wiring grid 20 are electrically connected through a wiring connection 25 which is extended sideways from the first metal wiring 24 and a contact hole 28a which is formed above a lattice point 22 of the contact grid which is a contact hole placeable position. Also, the first layer metal wiring 24 under the second insulating layer 34 and the second layer metal wiring 26 formed on the second insulating layer 34 and along a line connecting the lattice points 21 of the wiring grid 20 are electrically connected through a wiring connection 25 which is extended sideways from the first metal wiring 24, a via hole 30a which is formed above a lattice point 23 of the via grid which is a via hole placeable position, and a wiring connection 27 which is extended sideways from the second metal wiring 26. Since wiring metals are etched by the thickness of wiring metal or further by an etching margin, portions of wiring metals are left in holes. Note that unused contact holes 28b which are not used for connection between the underlying layer containing the basic cells 12 and the first layer metal wiring 24 and unused via holes 30b which are not used for connection between the first and second layer metal wirings 24 and 26 are left open in the first and second insulating layers 32 and 34, respectively, with no contact being made between the underlying layer and the custom wiring and between upper and lower custom wirings, and are eventually refilled or covered with the second insulating layer 34 and passivation layer 36, respectively, for insulation. It is also acceptable to fill unused contact holes 28a and unused via holes 30b with the customizing wiring metal and to deposit the second insulating layer 34 and passivation layer 36 thereon for eventually providing insulation from the first and second layer metal wirings 24 and 26, respectively.

The wiring metal left in the holes may be removed completely. Further, metal wire-forming masks may be so fabricated as the caused contact holes and via-holes are covered at the circumference of hole with the wiring metal by the distance of M(>0, e.q.(W−w)/2), though the modification brings about unfavorable enlarged sizes of basic cells.

FIG. 4(b) is a schematic cross-section taken along lines B—B in FIG. 4(a) of an area surrounding a contact hole 28a used for connection. The contact hole 28a is previously formed together with all the remaining contact holes 28 at lattice points 22 of the contact grid by perforating the first insulating layer 32 on the diffusion layer 14 of the basic cell 12 through a common contact mask. The contact hole 28a to serve for connection is filled with a custom wiring metal, for example, aluminum (Al) when the first layer metal wiring 24 is formed using a first layer metal wiring-forming mask. At this point, above the contact hole 28a, a wiring connection 25 which is of a rectangular (square) shape having a predetermined size (width) W greater than the width w of the contact hole 28a and the width b of the metal wiring 24, spreads over the first insulating layer 32, and is extended from the first metal wiring 24 sideways (in a direction perpendicular to the metal wiring 24) is formed simultaneous with formation of the first metal wiring 24, insuring electrical connection between the first layer metal wiring 24 and a metal fill 29 in the contact hole 28a and hence, electrical connection with the diffusion layer 14.

FIG. 4(c) is a schematic cross-section taken along lines C—C in FIG. 4(a) of an area surrounding a via hole 30a used for connection. The via hole 30a is previously formed together with all the remaining via holes 30 at lattice points 23 of the via grid by perforating the second insulating layer 34 on the first insulating layer 32 and the first layer metal wiring 24 thereon through a common via mask. The via hole 30a to serve for connection between the metal wirings 24 and 26 is filled with a custom wiring metal, for example, aluminum (Al) when the second layer metal wiring 26 is formed using a second layer metal wiring-forming mask. At this point, at lattice points 23 of the via grid, the first layer metal wiring 24 is extended sideways to form at the distal end a wiring connection 25 of a rectangular (square) shape having a predetermined size (width) W greater than the width b of the metal wiring 24 and the width w of the via hole 30a. A wiring connection 27 which is formed above the via hole 30a together with the second layer metal wiring 26 so as to extend over the second insulating layer 34 is extended sideways from the second layer metal wiring 26 and has a rectangular (square) shape having a predetermined size (width) $W_2$ greater than the size W of the wiring connection 25 which is greater than the width w of the via hole 30a. This insures electrical connection between the wiring connection 25 extended from the first layer metal wiring 24 and a metal fill 31 in the via hole 30a and electrical connection between the metal fill 31 in the via hole 30a and the wiring connection 27 extended from the second layer metal wiring 26, thereby insuring electrical connection between the first and second layer metal wirings 24 and 26.

FIG. 4(d) is a schematic cross-section taken along lines D—D in FIG. 4(a) of an area surrounding an unused contact hole 28b which is formed simultaneous with the contact hole 28a used for connection. The term "unused" means that the contact hole 28b is not used for providing a contact. It is seen that the contact hole 28b is left open after formation of the first layer metal wiring 24, refilled with the second insulating layer 34 and thus insulated. FIG. 4(e) is a schematic cross-section taken along lines E—E in FIG. 4(a) of an area surrounding an unused via hole 30b which is formed simultaneous with the via hole 30a used for connection. It is seen that the via hole 30b is left open after formation of the second layer metal wiring 26, refilled with the passivation layer 36 and thus insulated. As previously mentioned, it is also acceptable to partially or entirely fill these unused holes 28b and 30b with the wiring metal and finally deposit the insulating layer 32 or 34 thereon for providing insulation.

Basically the semiconductor device of the invention and the master wafer used therefor are constructed as above. Now the method for fabricating the semiconductor device is described. The following cross-sectional views are drawn schematically for illustrative purpose, despite a contact portion of diffusion layer and a contact portion of gate cannot exist on the same cross-sectional plane.

Figure 5A:
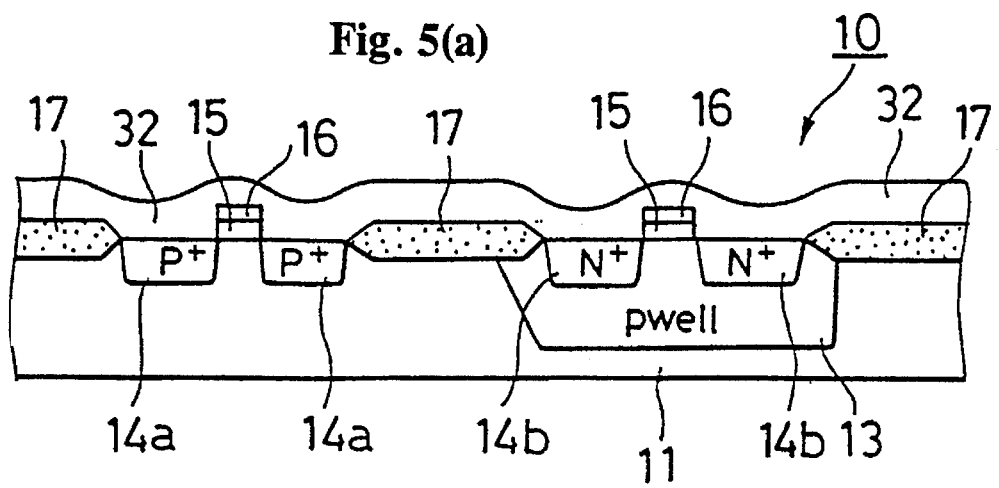
FIGS. 5(a), 5(b), and 5(c) are schematic cross-sectional views showing successive steps of a master wafer fabrication method according to the present invention.
Figure 5B:
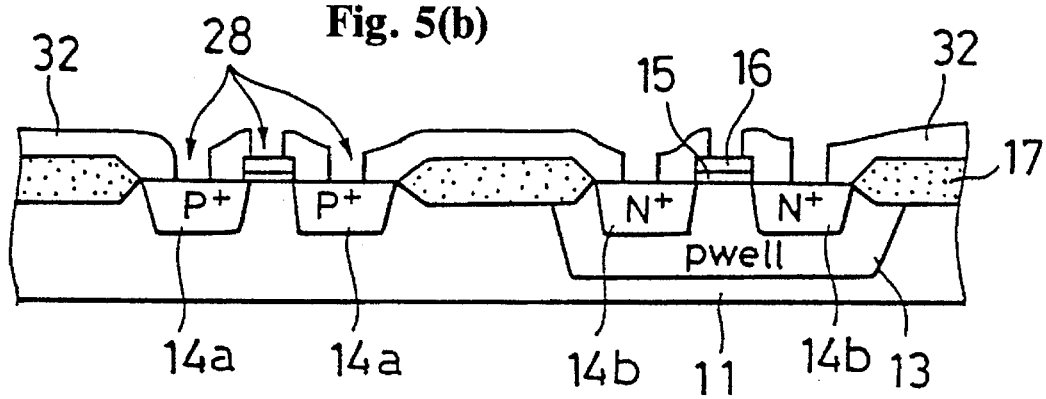
Figure 5C:
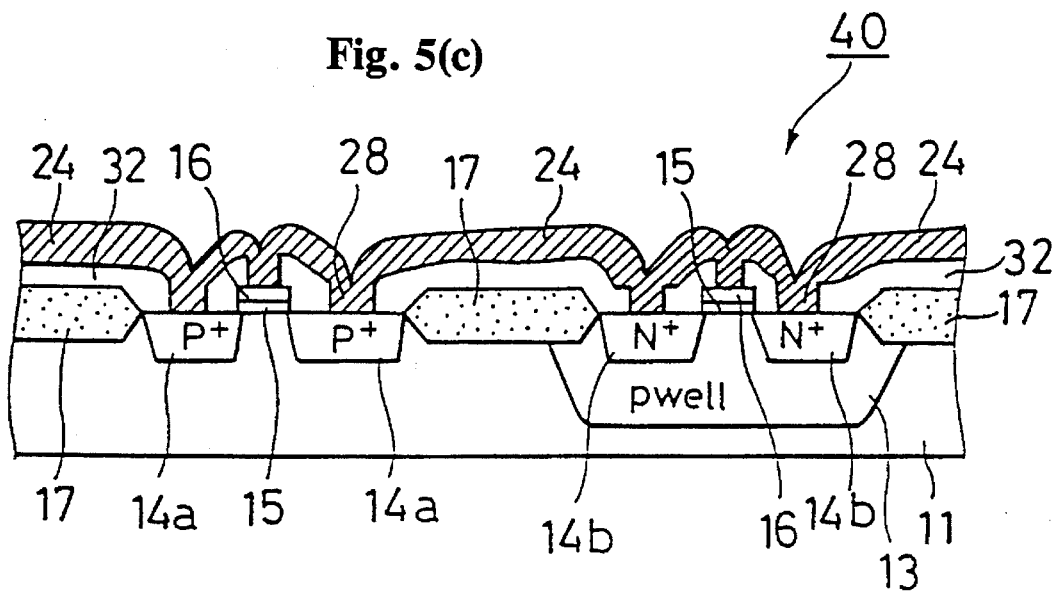

FIGS. 5(a) to 5(c) and FIGS. 6(a) to 6(g) are schematic cross-sectional views showing a master wafer fabricating process and a double layer wiring process for use in fabricating a semiconductor device according to the inventive method. It will be understood that FIG. 5(c) illustrates one exemplary master wafer according to the invention.

Figure 10A:
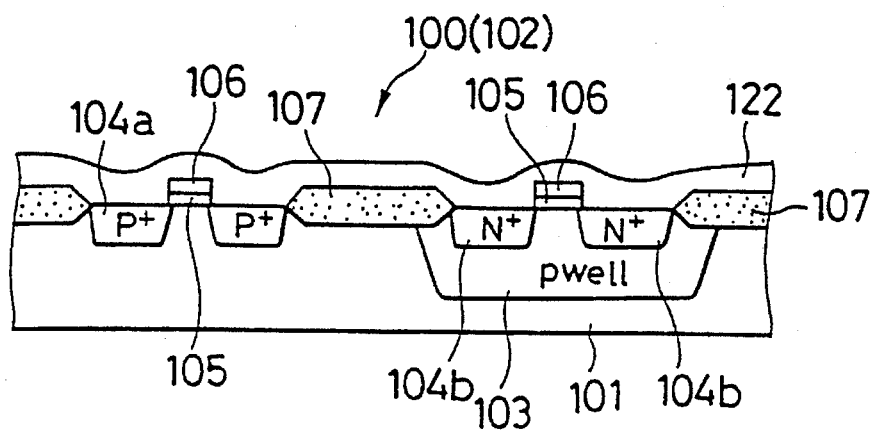
FIG. 10(a) to 10(g) are schematic cross-sectional views showing successive steps of a prior art semiconductor device fabrication method.
Figure 10B:
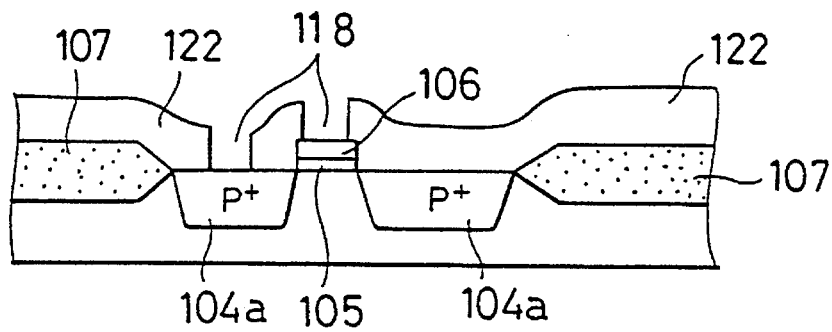
Figure 10C:
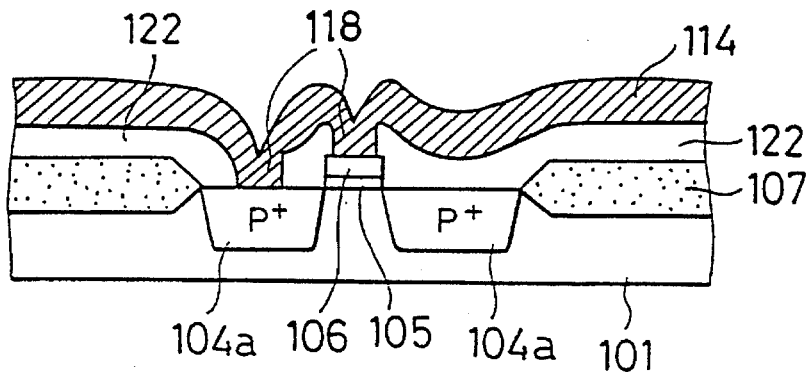
Figure 10D:
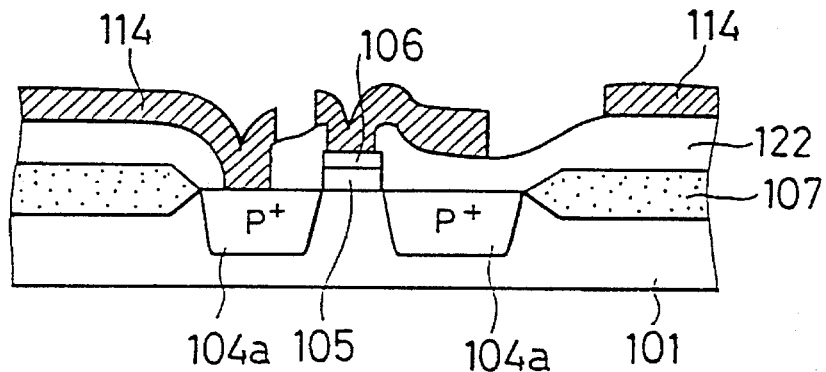
Figure 10E:
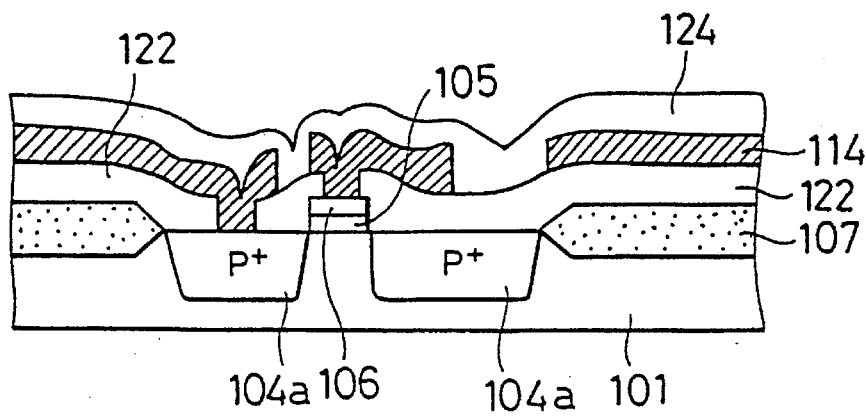
Figure 10F:
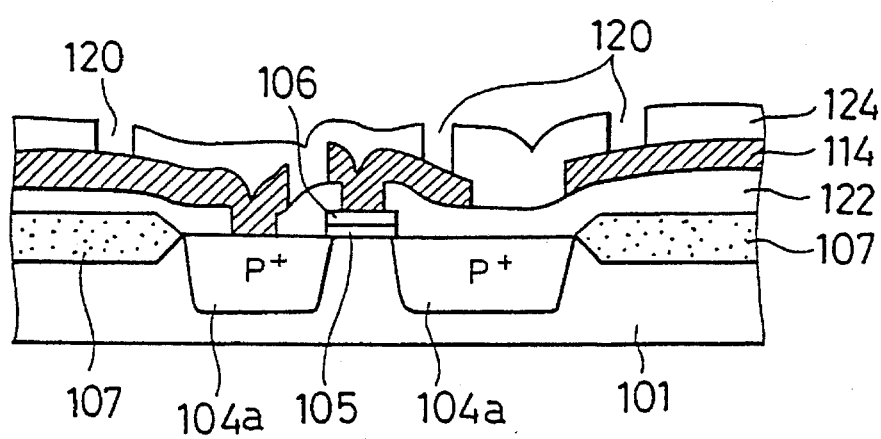
Figure 10G:
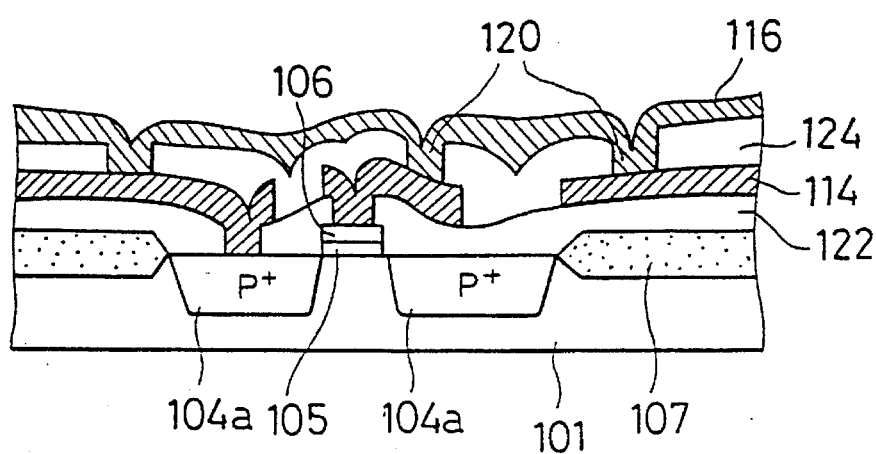

FIG. 5(a) illustrates a gate array 10 of the same construction as a semi-custom semiconductor device using a conventional master slice approach, for example, a master wafer of a gate array as shown in FIG. 10(a). The gate array 10 includes basic cells formed on a silicon substrate 11 in a two-dimensional array and a first interlayer insulating film (first insulating layer) 32 deposited thereon to cover the entire surface. In the basic cell 12 of the gate array 10, on the left side of the figure, a polysilicon gate 16 is formed on the N type silicon substrate 11 through a gate oxide film 15 and $P^+$ diffusion layers 14a are formed in the silicon substrate 11 on opposite sides of the polysilicon gate 16. On the right side of the figure, a P well 13 is formed in the N type silicon substrate 11, a polysilicon gate 16 is formed on the P well 13 through a gate oxide film 15, and $N^+$ diffusion layers 14b are formed in the P well 13 on opposite sides of the polysilicon gate 16. An element isolation film 17 of $SiO_2$ is formed between the diffusion layers 14a and 14b by LOCOS. On the silicon wafer in which the basic cells 12 of the above-mentioned construction are formed in a two-dimensional array, is formed the first interlayer insulating film (first insulating layer) 32 which covers the entire surface above the basic cells 12.

The method of forming basic cells in the silicon substrate 11 is not critical and any of conventional well-known methods may be used. The first insulating layer 32 and its formation method are not critical. Any of conventional well-known insulating films such as silicon oxide ($SiO_2$), phosphorus glass (PSG), silicon nitride, and spin-on glass films may be formed by any of conventional well-known methods such as PVD methods (e.g., heat evaporation and spuntering), CVD methods and coating or baking methods.

Next, as shown in FIG. 5(b), contact holes 28 are formed in the first insulating layer 32 at all contact hole placeable positions as shown in FIGS. 1(a), 3 and 4(a), that is, all lattice points 22 of the contact grid by photolithography using a contact hole sharing mask (not shown). The photolithography for forming the contact holes 28 may be a conventional well-known one except for the use of a contact hole sharing mask. For example, the contact holes 28 are formed by applying a resist to the gate array 10 shown in FIG. 5(a), exposing the resist through a contact hole sharing mask, developing the resist to form a mask, and etching the first insulating layer through the mask.

Subsequently, as shown in FIG. 5(c), on the gate array 10 having the contact holes 28 thus formed, is formed a first metal layer 24, for example, an aluminum (Al) film which fills up the contact holes 28 and covers the first insulating layer 32. The material and method of forming the first metal layer 24 are not critical. Any of conventional well-known wiring metal materials such as Al and Al alloys may be used. Exemplary methods are PVD methods such as evaporation and sputtering. In this way, there is obtained a master wafer 40 as shown in FIG. 5(c).

The method for fabricating a semiconductor device according to the present invention includes a master wafer fabricating process involving from a conventional master wafer as shown in FIG. 5(a) to the steps of forming the contact holes 28 and first metal layer 24 as shown in FIG. 5(b) and 5(c) and a customizing process involving from the master wafer 40 having the contact holes 28 and first metal layer 24 formed as shown in FIG. 5(c) to steps of customizing the master wafer until an intended semiconductor device is obtained. The customizing process according to the invention is described below.

Figure 6A:
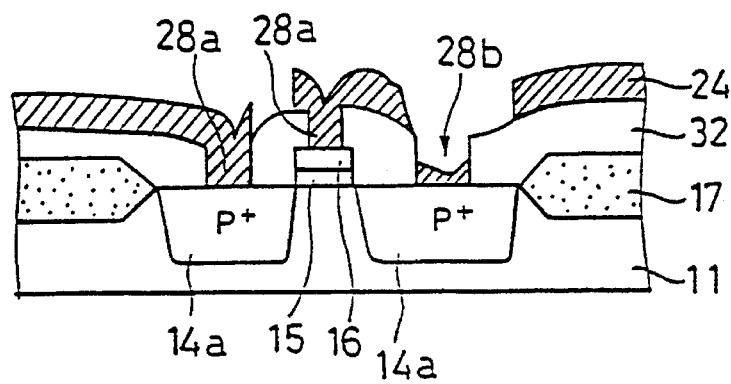
FIGS. 6(a) to 6(g) are schematic cross-sectional views showing successive steps of a semiconductor device fabrication method according to the present invention.

The master wafer 40 shown in FIG. 5(c) is etched by photolithography using a first layer metal wiring-forming custom mask before a first layer metal wiring 24 is formed as shown in FIG. 6(a). At this point, the first layer metal wiring 24 has a predetermined custom wiring pattern and is formed to a predetermined width b on the custom wiring grid 20 as shown in FIGS. 3 and 3(a). The wiring 24 on the grid 20 is extended to a wiring connection 25 in a contact hole 28 requiring connection. To provide connection to a via hole 30a requiring connection, the wiring 24 is also extended to a wiring connection 25 to be formed at a lattice point 23 where the via hole 30a is formed, as will be described later.

Figure 6B:
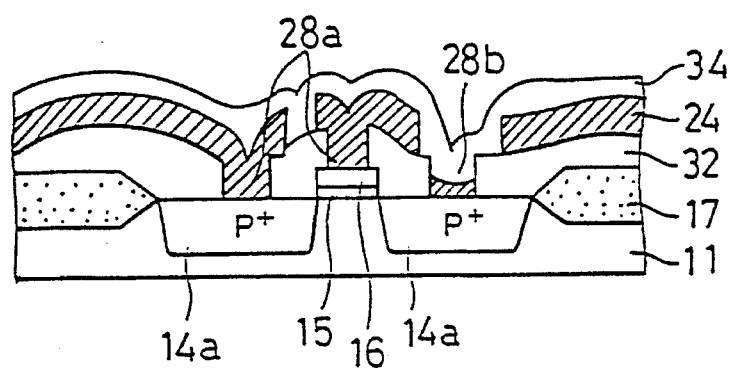
Figure 6C:
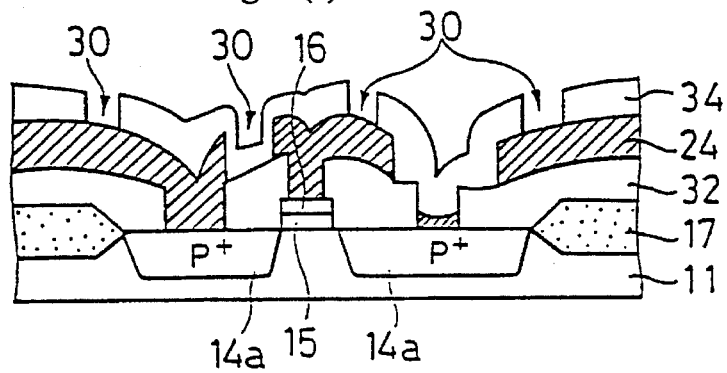

Next, like the first insulating layer 32, a second interlayer insulating film (or second insulating layer) 34 is formed on the first layer metal wiring 24 as shown in FIG. 6(b). The unused contact hole 28b, which remains open with an amount of the first layer metal wiring material left at the bottom as shown in FIG. 6(a), is now refilled with the second insulating layer 34, insuring sufficient insulation. Subsequently, as shown in FIG. 6(c), via holes 30 are formed in the second insulating layer 34 at all via hole placeable positions as shown in FIGS. 3 and 4(a), that is, all lattice points 23 of the via grid, by photo-lithography using a via hole sharing mask (not shown). The photolithography of forming the via holes 30 may be the same as the contact hole-forming photolithography. It is to be noted that although the via hole sharing mask is used in forming the via holes in this embodiment, the invention is not limited thereto. It is acceptable to use the contact hole sharing mask as such, another via hole-forming mask, or a customizing via hole-forming mask.

Figure 6D:
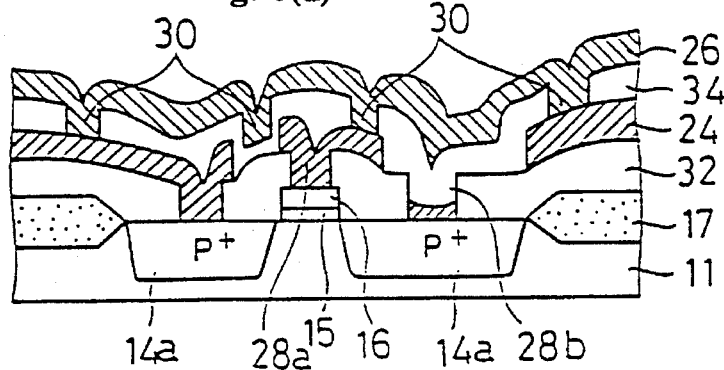
Figure 6E:
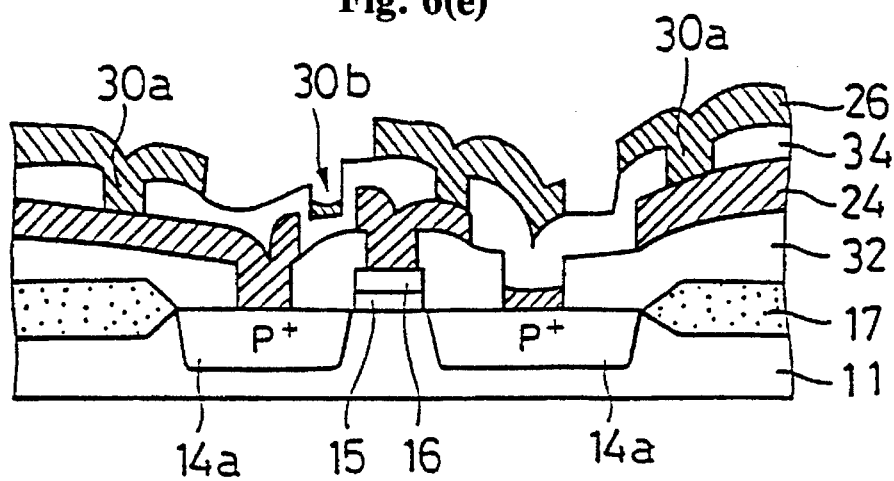

Next, like the first metal layer 24, a second metal layer 26 is formed which fills the via holes 30 and covers the second insulating layer 34 as shown in FIG. 6(d). Subsequently, like the first layer metal wiring 24, the second metal layer 26 is etched by photolithography using a second layer metal wiring-forming custom mask, forming a second layer metal wiring 26 having a predetermined custom wiring pattern on the custom wiring grid 20 as shown in FIG. 6(e). Also herein, a wiring connection 27 which is extended from the second layer metal wiring 26 and formed at the position where the via hole 30a is formed is provided so that it may be connected through the via hole 30a to the wiring connection or pad 25 which is extended from the first layer metal wiring 24 and formed at the via hole-forming position (lattice point 23) as shown in FIGS. 3 and 4(a).

Figure 6F:
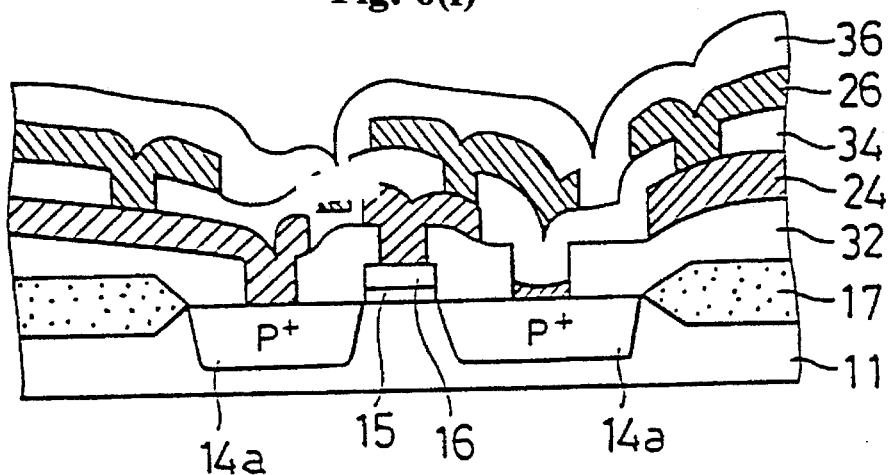
Figure 6G:
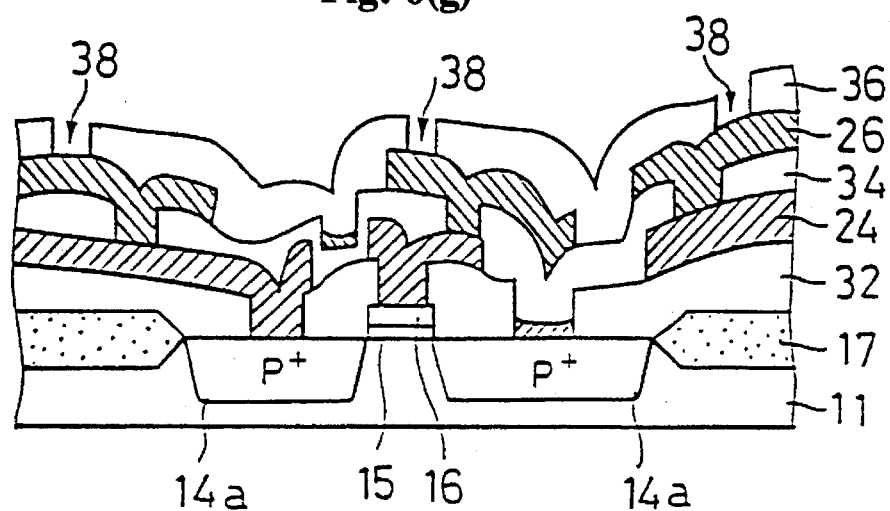
Figure 7:
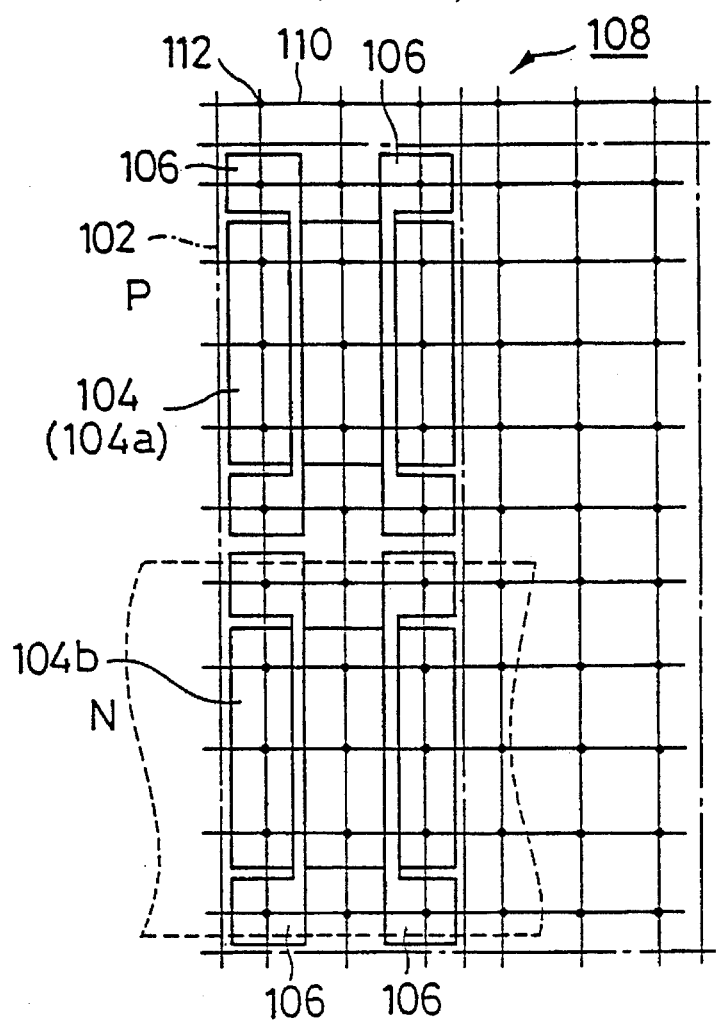
FIG. 7 is a schematic view showing the grid structure of a prior art semiconductor device.

Thereafter, a passivation film 36 is formed on the second layer metal wiring 26 as shown in FIG. 6(f). Bonding via holes or bonding pads 38 are formed in the passivation film 36 using a passivation via sharing mask as shown in FIG. 6(g). It is not critical how to form the passivation film 36 and bonding via holes or bonding pads 38 and any of conventional well-known methods may be used.

In this way, a two-level wiring semiconductor device of the invention is fabricated.

According to the present invention, the steps of forming contact holes and first metal layer which belong to customizing steps in the prior art method are included in the master. The gate array 10 possessing contact holes and covered with the first metal layer in the master state is used as a master wafer 40. Thus the invention reduces the number of customizing steps by two steps. For example, the prior art method includes nine (9) basic customizing steps from a master wafer having the first interlayer insulating film 32 formed thereon to the step of forming bonding via holes (or the step of etching the passivation film) whereas the method of the invention reduces the basic customizing steps to seven (7) steps from a master wafer 40 shown in FIG. 5(c) to the step of forming bonding via holes shown in FIG. 6(g) because the preceding two steps are incorporated in the master wafer fabrication process.

Therefore, the invention can shorten the customizing process and reduce the period taken until product delivery. For example, a prior art two-level wiring process required four (4) custom masks or reticles for forming contact holes, first layer metal wiring, via holes and second layer metal wiring whereas the method of the invention requires to newly prepare only two custom masks for forming first and second metal wirings where a common via hole-forming mask is used, and is thus effective in reducing the mask manufacturing cost and shortening the manufacturing period.

In the above-mentioned embodiment, the semiconductor device of the invention is a semiconductor integrated circuit of a two level wiring structure using two metal layers for custom wiring which is fabricated from the master wafer 40 of the invention obtained through the steps of FIGS. 5(a) to 5(c), by subjecting the master wafer 40 to the steps of FIGS. 6(a) to 6(g). The semiconductor device has a triple grid structure consisting of the contact grid for contact holes 28, the wiring grid 20 for forming a custom wiring layer, and the via grid for via holes 30 wherein the contact grid consisting of lattice points 22 and the via grid consisting of lattice points 23 is displaced from the wiring grid 20 consisting of lattice points 21 by the predetermined spacing La or more; all the grids have the same uniform lattice spacing Lb (wherein Lb also satisfies the above-mentioned requirement with respect to the via hole 30a); and the overlap between the contact hole 28a to be connected and the via hole 30a to be connected is considered. The present invention is not limited to this embodiment. The present invention may use a single level wiring structure and hence, a double grid structure consisting of the contact grid and the wiring grid, with the second layer wiring-forming process using the via hole 30a as shown in FIGS. 6(b) to 6(e) being omitted. Alternatively, a multi-level wiring structure of at least three layers may be used wherein the wiring forming process using via holes as shown in FIGS. 6(b) to 6(e) is repeated so that via holes in respective wiring layers are offset to provide plural sets of via holes, via 1 holes, via 2 holes, . . . , and a multiple grid structure of four or more grids including via 1 grid, via 2 grid, . . . corresponding thereto is provided. Even for the multi-level wiring structure of at least three layers, a triple grid structure can be used by sharing the via hole positions between respective wiring layers. Even for the multi-level wiring structure of at least two layers, a double grid structure of a grid for forming connection holes and a custom wiring grid may be used by sharing the positions of contact holes and all via holes.

As mentioned above, the semiconductor device of the invention and the semiconductor device fabricated by the inventive method may use a double or multiple grid structure wherein all connection holes such as contact holes and via holes which are placeable on a master chip can be formed so that masks for forming connection holes such as a mask for forming contact holes and a mask for forming via holes can be commonly sized for each chip size. According to the present invention, since wiring grids are identical for the same chip size, the double grid structure permits to share a common mask for forming contact holes; the triple grid structure permits not only the contact hole-forming mask, but also the via hole-forming mask to be shared; and the multiple grid structure permits to share plural sets (at most the number of grids minus 2) of via holes between respective wiring layers.

Moreover, the semiconductor device of the present invention is not limited to the SOG type gate array of the illustrated embodiment, but applicable to any gate array wherein wiring has a grid structure, for example, a channel gate array, embedded cell array and standard cell. The grid used herein is not limited to the positions of contact holes, custom wiring layer and via holes, but equally applicable to plural sets of via holes between multi-level wirings.

The present invention provides a multi-level wiring structure in which among masks for forming contact holes, first layer metal wiring, via holes, second layer metal wiring, etc. which are otherwise to be customized, at least a contact hole-forming mask and a via hole-forming mask can be common for the same chip size and these masks do not need customization.

Also the master wafer of the invention can be a prior art master wafer to which two additional steps, a step of forming contact holes in the first interlayer insulating film and a step of coating a first metal layer thereon, has been applied. Then the use of the master wafer of the invention can shorten the basic customizing steps by removing these two steps, thereby shortening the period taken until product delivery.

Since the positions of contact holes and via holes are predetermined, no computation is necessary during designing with respect to contact holes and via holes, resulting in a substantially reduced load to the computer.

Since the number of masks to be newly prepared in the manufacture of a novel semiconduct or chip can be substantially reduced, for example, by one-half or more, it is possible to reduce the duration and cost of mask preparation and shorten the time taken in site for qualification of masks, eventually leading to a shortening of the period taken until product delivery and a cost reduction.

The prior art method suffers from a low wiring yield in that since the second layer metal wiring passes across a connection through a contact hole between the underlying layer and the first layer metal wiring, the wiring also passes over a step created in forming a connection in a contact hole. In contrast, the invention improves the wiring yield since the wiring does not pass over connections in contact holes.

Although some preferred embodiments have been described, many modifications and variations may be made thereto in the light of the above teachings. It is therefore to be understood than within the scope of the appended claims, the invention may be practiced otherwise than as specifically described.

I claim:

1. A semiconductor device adapted for a master slice approach, comprising basic cells arranged in an array, wherein the cells are configured such that positions of connection holes to be placed relative to the basic cell are at lattice points of a hole placement grid which is spaced a predetermined distance from a custom wiring grid having a uniform predetermined lattice spacing equal to the lattice spacing of the hole-placement grid.

2. The semiconductor device of claim 1 wherein said connection holes are formed using a common connection hole-forming mask through which a common master wafer is perforated at all connection hole placeable positions.

3. The semiconductor device of claim 2 wherein the predetermined distance between at least one of the connection holes and the custom wiring grid is sized such that said at least one of said connection holes does not contact with an adjacent custom metal wiring.

4. The semiconductor device of claim 3 wherein wiring to said at least one of said connection holes is carried out by a custom metal wiring extension from a custom metal wiring formed on said custom wiring grid to a wiring connection in electrical communication with said at least one of said connection holes.

5. The semiconductor device of claim 4 wherein said predetermined lattice spacing is sized such that the wiring connection in electrical communication with said at least one of said connection holes which is connected with the custom metal wiring extension is not in electrical communication with said adjacent custom metal wiring.

6. The semiconductor device of claim 5 wherein a portion of the wiring metal is left in unused connection holes, and the remaining wiring metal is insulated from other metal wirings with interlayer insulating films.

7. The semiconductor device of claim 6 wherein a predetermined number of said connection holes are contact holes for providing connection between an underlying layer where the basic cells are formed and a first wiring layer.

8. The semiconductor device of claim 6 wherein a predetermined number of said connection holes are via holes for providing connection between wiring layers.

9. The semiconductor of claim 5 wherein the wiring metal is removed complete from inside of unused connection holes, and the inside of the unused connection holes is filled with interlayer insulating films.

10. The semiconductor device of claim 9 wherein a predetermined number of said connection holes are contact holes for providing connection between an underlying layer where the basic cells are formed and a first wiring layer.

11. The semiconductor device of claim 9 wherein a predetermined number of said connection holes are via holes for providing connection between wiring layers.

12. A master wafer for use in the fabrication of a semiconductor device adapted for a master slice approach, comprising an array of basic cells arranged on a silicon wafer, a first interlayer insulating film deposited on said basic cells and having contact holes reaching said basic cells at all contact hole placeable positions aligned with lattice points of a hole-placement grid spaced a predetermined distance from a custom wiring grid having a predetermined lattice spacing to be set relative to said basic cells, wherein said predetermined lattice spacing of said custom wiring grid is equal to the lattice spacing of said hole-placement grid, and a first metal layer which fills said contact holes and covers the entire surface of said first interlayer insulating film in order to form a custom metal wiring on said custom wiring grid and a custom metal wiring extension from the custom metal wiring to a wiring connection in electrical communication with one of said contact holes.

* * * * *